(12) United States Patent
Dai

(10) Patent No.: US 11,227,904 B2
(45) Date of Patent: Jan. 18, 2022

(54) METHOD FOR MANUFACTURING LIGHT-EMITTING LAYER, ELECTROLUMINESCENT DEVICE AND DISPLAY DEVICE

(71) Applicant: BOE TECHNOLOGY GROUP CO., LTD., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 481 days.

(21) Appl. No.: 16/303,482

(22) PCT Filed: Apr. 10, 2018

(86) PCT No.: PCT/CN2018/082521
§ 371 (c)(1),
(2) Date: Nov. 20, 2018

(87) PCT Pub. No.: WO2019/041820
PCT Pub. Date: Mar. 7, 2019

(65) Prior Publication Data
US 2021/0225966 A1 Jul. 22, 2021

(30) Foreign Application Priority Data
Aug. 29, 2017 (CN) .......................... 201710758714.2

(51) Int. Cl.
*H01L 27/32* (2006.01)
*H01L 51/56* (2006.01)

(52) U.S. Cl.
CPC ........ *H01L 27/3246* (2013.01); *H01L 27/326* (2013.01); *H01L 51/56* (2013.01)

(58) Field of Classification Search
CPC .... H01L 27/3246; H01L 27/326; H01L 51/56
(Continued)

(56) References Cited

U.S. PATENT DOCUMENTS 7,888,867 B2    2/2011  Koshida et al.
9,111,892 B2    8/2015  Nendai et al.
(Continued)

FOREIGN PATENT DOCUMENTS

CN    102388673 A    3/2012
CN    103165527 A    6/2013
(Continued)

OTHER PUBLICATIONS

Chinese Office Action in Chinese Application No. 201710758714.2, dated Mar. 4, 2020 with English translation.
(Continued)

*Primary Examiner* — Dzung Tran
(74) *Attorney, Agent, or Firm* — Collard & Roe, P.C.

(57) ABSTRACT

A method for manufacturing a light-emitting layer, an electroluminescent device and a display device are provided, and the method includes: providing a base substrate formed with a pixel definition layer, so that a plurality of barrier wall structures of the pixel definition layer define a plurality of pixel regions that include pixel regions arranged along a first direction and pixel regions arranged along a second direction; forming a solution layer on the base substrate formed with the pixel definition layer, so that the solution layer includes a solution formed in the plurality of pixel regions and a solution formed on first barrier wall structures and the solution in the pixel regions does not blend with the solution on the first barrier wall structures; performing a drying process on the solution layer so that the solution in each pixel region forms a light-emitting structure to obtain a light-emitting layer.

19 Claims, 11 Drawing Sheets

(58) Field of Classification Search
USPC .......................................................... 257/40
See application file for complete search history.

(56) References Cited

U.S. PATENT DOCUMENTS

| | | | |
|---|---|---|---|
| 9,818,802 B2 | 11/2017 | Iguchi et al. | |
| 2006/0188661 A1* | 8/2006 | Hirai | H05K 3/1258 427/533 |
| 2006/0284957 A1* | 12/2006 | Chou | G02B 5/201 347/107 |
| 2007/0252518 A1 | 11/2007 | Lee et al. | |
| 2008/0252200 A1 | 10/2008 | Wang et al. | |
| 2012/0040478 A1 | 2/2012 | Takeuchi | |
| 2013/0153937 A1 | 6/2013 | Cho | |
| 2014/0061603 A1* | 3/2014 | Kim | H01L 51/5253 257/40 |
| 2014/0203303 A1* | 7/2014 | Jiang | H01L 51/56 257/88 |
| 2014/0361278 A1 | 12/2014 | Kim et al. | |
| 2016/0043150 A1* | 2/2016 | Wang | H01L 51/56 257/40 |
| 2016/0351632 A1 | 12/2016 | Iguchi et al. | |
| 2016/0365396 A1 | 12/2016 | Jiao et al. | |
| 2017/0104173 A1 | 4/2017 | Kim | |

FOREIGN PATENT DOCUMENTS

| | | | |
|---|---|---|---|
| CN | 103715218 | A | 4/2014 |
| CN | 104299968 | A | 1/2015 |
| CN | 104882468 | A | 9/2015 |
| CN | 104299968 | B | 4/2017 |
| JP | 2004230209 | A | 8/2004 |
| JP | 2005-276479 | A | 10/2005 |
| JP | 2010073700 | A | 4/2010 |
| JP | 2016-126860 | A | 7/2016 |
| KR | 10-2007-0106240 | A | 11/2007 |
| WO | 2013080490 | A1 | 6/2013 |
| WO | 2017/135227 | A1 | 8/2017 |

OTHER PUBLICATIONS

Korean Office Action in Korean Application No. 10-2018-7035925, dated Jan. 13, 2020 with English translation.
Indian Office Action in Indian Application No. 201817044231, dated Jun. 25, 2020.
International Search Report of PCT/CN2018/082521 in Chinese, dated Jul. 13, 2018, with English translation.
Notice of Transmittal of the International Search Report of PCT/CN2018/082521 in Chinese, dated Jul. 13, 2018.
Written Opinion of the International Searching Authority of PCT/CN2018/082521 in Chinese, dated Jul. 13, 2018 with English translation.
Extended European Search Report in European Patent Application No. 18803306.2 dated Jun. 11, 2021.
Japanese Office Action in Japanese Application No. 2018-561620 dated Nov. 1, 2021 with English translation.

* cited by examiner

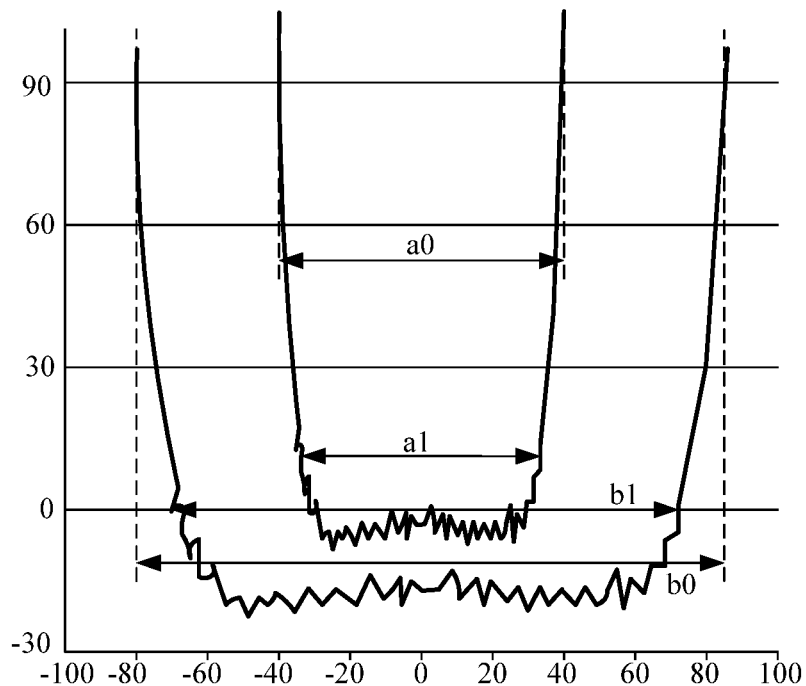

FIG. 1

| Providing a base substrate formed with a pixel definition layer, so that the pixel definition layer includes a plurality of barrier wall structures, the plurality of barrier wall structures define a plurality of pixel regions arranged in an array on the base substrate, the plurality of pixel regions include a plurality of pixel regions arranged along a first direction and a plurality of pixel regions arranged along a second direction, and a distance between any adjacent two of the pixel regions arranged along the first direction is greater than a distance between any adjacent two of the pixel regions arranged along the second direction | 201 |

↓

| By a solution-applying process, forming a solution layer on the base substrate formed with the pixel definition layer, so that the solution layer includes a solution formed in the plurality of pixel regions and a solution formed on the first barrier wall structures, and the solution in any one of the plurality of pixel regions does not blend with the solution on the first barrier wall structures defining the any one of the plurality of pixel regions | 202 |

↓

| Drying the solution layer so that the solution in each of the plurality of pixel regions forms a light-emitting structure to obtain the light-emitting layer | 203 |

METHOD FOR MANUFACTURING LIGHT-EMITTING LAYER, ELECTROLUMINESCENT DEVICE AND DISPLAY DEVICE

CROSS REFERENCE TO RELATED APPLICATIONS

This application is the National Stage of PCT/CN2018/082521 filed on Apr. 10, 2018, which claims priority under 35 U.S.C. § 119 of Chinese Application No. 201710758714.2 filed on Aug. 29, 2017, the disclosure of which is incorporated by reference.

TECHNICAL FIELD

The present disclosure relates to a method for manufacturing a light-emitting layer, an electroluminescent device and a display device.

BACKGROUND

Organic light-emitting diode (OLED) display devices have the advantages of being thin and light, and having a low power consumption, a high contrast and a high color gamut as well as being capable of realizing flexible display, and thus are widely used in the display industry. OLED display devices mainly rely on the OLEDs, which are electroluminescent elements, for image display.

SUMMARY

Embodiments of the present disclosure provide a method for manufacturing a light-emitting layer, and the method includes: providing a base substrate formed with a pixel definition layer, so that the pixel definition layer includes a plurality of barrier wall structures, the plurality of barrier wall structures include a plurality of first barrier wall structures, the plurality of barrier wall structures define a plurality of pixel regions arranged in an array on the base substrate, the plurality of pixel regions include a plurality of pixel regions arranged along a first direction and a plurality of pixel regions arranged along a second direction, and a distance between any adjacent two of the pixel regions arranged along the first direction is greater than a distance between any adjacent two of the pixel regions arranged along the second direction; by a solution-applying process, forming a solution layer on the base substrate formed with the pixel definition layer, so that the solution layer includes a solution formed in the plurality of pixel regions and a solution formed on the plurality of first barrier wall structures, the plurality of first barrier wall structures are between the pixel regions arranged along the first direction, and the solution in any one of the plurality of pixel regions does not blend with the solution on the first barrier wall structures defining the any one of plurality of pixel regions; and performing a drying process on the solution layer so that the solution in each of the plurality of pixel regions forms the light-emitting layer.

According to the embodiments of the present disclosure, for example, in the above method, the plurality of barrier wall structures further include a plurality of second barrier wall structures, the solution layer further includes a solution formed on the plurality of second barrier wall structures, the plurality of second barrier wall structures are between the pixel regions arranged along the second direction, the solution in the any one of the plurality of pixel regions does not blend with the solution on the plurality of second barrier wall structures defining the any one of the plurality of pixel regions, and a volume of the solution on a single one of the plurality of second barrier wall structures is smaller than a volume of the solution on a single one of the plurality of first barrier wall structures.

According to the embodiments of the present disclosure, for example, in the above method, the plurality of first barrier wall structures are formed with at least one first groove, and the solution on the plurality of first barrier wall structures is in the at least one first groove; before forming the solution layer on the base substrate formed with the pixel definition layer by the solution-applying process, the method further includes: forming the at least one first groove in the plurality of first barrier wall structures by performing a patterning process on the pixel definition layer.

According to the embodiments of the present disclosure, for example, in the above method, a shape of the first groove on an opening side of the first groove is circular or tetragonal.

According to the embodiments of the present disclosure, for example, in the above method, first grooves of the at least one first groove in the plurality of first barrier wall structures which are on a same side of any adjacent two of the plurality of pixel regions arranged along the second direction communicate with each other.

According to the embodiments of the present disclosure, for example, in the above method, a second groove is formed between the first grooves being in two first barrier wall structures which are on the same side of any adjacent two of the plurality of pixel regions arranged along the second direction, any adjacent two of the first grooves communicate with each other through the second groove that is between the any adjacent two of the first grooves, forming the at least one first groove in the plurality of first barrier wall structures by performing the patterning process on the pixel definition layer includes: forming at least one first groove in the plurality of first barrier wall structures by performing the patterning process on the pixel definition layer; and forming the second groove between the first grooves being in the two first barrier wall structures which are on the same side of any adjacent two of the plurality of pixel regions arranged along the second direction, so that any adjacent two of the first grooves communicate with each other through the second groove that is between the any adjacent two of the first grooves.

According to the embodiments of the present disclosure, for example, in the above method, a depth of the first groove is greater than or equal to a depth of the second groove, and an area of the first groove on the opening side of the first groove is greater than an area of the second groove on an opening side of the second groove.

According to the embodiments of the present disclosure, for example, in the above method, the pixel regions, the first groove and the second groove are formed by a same patterning process.

According to the embodiments of the present disclosure, for example, in the above method, the forming the solution layer on the base substrate formed with the pixel definition layer by the solution-applying process so that the solution layer includes the solution formed in the plurality of pixel regions and the solution formed on the plurality of first barrier wall structures, includes: forming the solution in the plurality of pixel regions by a first solution-applying process; and forming the solution on the plurality of first barrier wall structures by a second solution-applying process to obtain the solution layer.

According to the embodiments of the present disclosure, for example, in the above method, the first solution-applying process includes an inkjet printing process, and the second solution-applying process includes any one of the inkjet printing process and a spray process.

According to the embodiments of the present disclosure, for example, in the above method, a volume of the solution on any one of the first barrier wall structures ranges from 1 picoliter to 200 picoliters.

According to the embodiments of the present disclosure, for example, in the above method, the volume of the solution on any one of the first barrier wall structures ranges from 10 picoliters to 100 picoliters.

The embodiments of the present disclosure further provide an electroluminescent device which includes the light-emitting layer manufactured by using the method described in any one of the above embodiments.

The embodiments of the present disclosure further provide a display device which includes the electroluminescent device described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1 is a comparison chart of curves between a theoretical size and an actual size of a light-emitting structure;

FIG. 2 is a flowchart of a method for manufacturing a light-emitting layer according to embodiments of the present disclosure;

DETAILED DESCRIPTION

Figure 3:
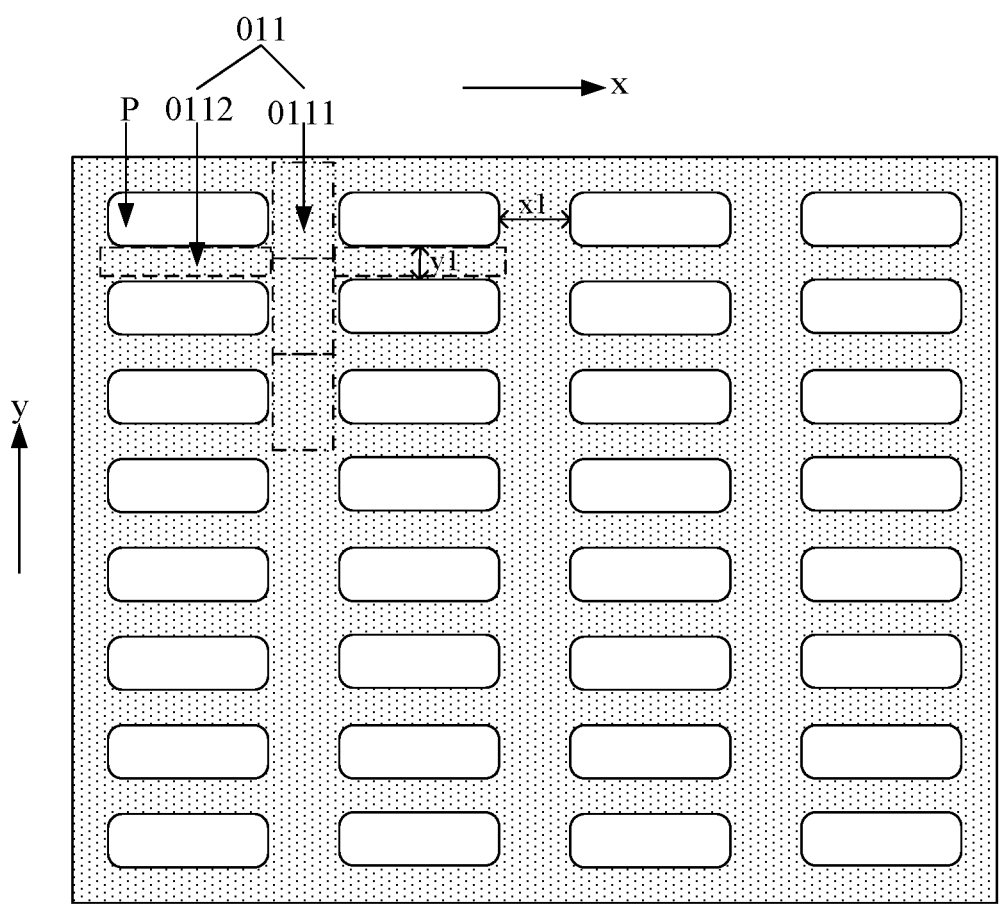
FIG. 3 is a schematic view of a base substrate formed with a pixel definition layer according to the embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The electroluminescent device generally includes a base substrate, and a thin film transistor (TFT for short) layer, an anode layer, a pixel definition layer (PDL for short), a light-emitting layer and a cathode layer which are sequentially disposed on the base substrate; the TFT layer includes a plurality of TFTs; the anode layer includes a plurality of anode structures; the light-emitting layer includes a plurality of light-emitting structures; and the TFTs, the anode structures and the light-emitting structures correspond to each other in a one-to-one manner. The pixel definition layer includes a plurality of barrier wall structures, the plurality of barrier wall structures define a plurality of pixel regions arranged in an array, the plurality of pixel regions include pixel regions arranged along a first direction and pixel regions arranged along a second direction, a distance between any adjacent two pixel regions among the pixel regions arranged along the first direction is not equal to a distance between any adjacent two pixel regions among the pixel regions arranged along the second direction, and each pixel region is provided with one light-emitting structure therein. At present, a wet film forming process is generally used to form the light-emitting layer. In the wet film forming process, a solution is filled in the pixel regions by a solution-applying process, and then a solvent in the pixel regions is removed by a depressurization drying process, so that a solute in the pixel regions forms the light-emitting structures, and thus the light-emitting layer is formed.

Because the distance between any adjacent two pixel regions among the pixel regions arranged along the first direction is not equal to the distance between any adjacent two pixel regions among the pixel regions arranged along the second direction, a micro-force that the solution in the pixel regions is subjected to in the first direction is different from another micro-force that the solution is subjected to in the second direction during the drying of the solution in the pixel regions, which results in the distribution of the solute in the first direction is different from the distribution of the solute in the second direction; on the other hand, because most of the pixel regions are of a rectangular-like shape, the light-emitting structures formed are also of the rectangular-like shape, so that the thickness uniformity of the light-emitting structure in a long-axis direction (a direction parallel to a long side of the light-emitting structure) and the thickness uniformity of the light-emitting structure in a short-axis direction (a direction parallel to a short side of the light-emitting structure) are difficult to achieve an optimum state simultaneously, and the appearance of the light-emitting structure is poor, resulting in poor uniformity of the light-emitting layer.

The electroluminescent device generally includes the base substrate, and the thin film transistor (TFT) layer, the anode layer, the pixel definition layer (PDL), the light-emitting layer and the cathode layer which are sequentially disposed on the base substrate. The TFT layer includes the plurality of TFTs, the anode layer includes the plurality of anode structures, the light-emitting layer includes the plurality of light-emitting structures, and the TFTs, the anode structures and the light-emitting structures correspond to each other in a one-to-one manner. The pixel definition layer includes the plurality of barrier wall structures, the plurality of barrier wall structures define the plurality of pixel regions arranged in an array, the plurality of pixel regions includes the pixel regions arranged along the first direction and the pixel regions arranged along the second direction, the distance between any adjacent two pixel regions among the pixel regions arranged along the first direction is not equal to the distance between any adjacent two adjacent pixel regions among the pixel regions arranged in the second direction, and one light-emitting structure is disposed in each pixel region.

In the process of manufacturing the electroluminescent device, the light-emitting layer is generally formed by using the wet film forming process. For example, firstly filling the solution (the solution is also called ink, and generally a mixture which includes a solute and a solvent and is used in the solution-applying process is referred to as the ink) into the pixel regions defined by the PDL; and then the solution in the pixel regions is subjected to a drying process by using the depressurization drying process, so that the solvent in the solution is removed, and the solute is dried to form the light-emitting structures, thereby forming the light-emitting layer. The shape of the light-emitting structure is generally rectangular-like, and the light-emitting structure includes the long-axis and the short-axis which are perpendicular to each other, for example; the dimension of the light-emitting structure along the long-axis direction is the length of the light-emitting structure, and the dimension of the light-emitting structure along the short-axis direction is the width of the light-emitting structure.

The depressurization drying process easily affects the solute distribution in the solution, resulting in poor uniformity of the formed light-emitting structure, and ultimately affecting the display effect and service life of the electroluminescent device. On one hand, in the depressurization drying process, the volume of the solution reduces as the solvent evaporates, but the interface position at which the solution initially contacts the PDL remains unchanged; therefore, the PDL produces a pinning effect which causes a climbing phenomenon at the edge of the formed light-emitting structure. For example, as shown in FIG. 1, the light-emitting structure has a theoretical width a0 and a theoretical length b0; and for the actually formed light-emitting structure, an actual width of a relatively flat region is a1, and an actual length of the relatively flat region is b1. It is desirable that the actual width a1 of the relatively flat region of the light-emitting structure is equal to the theoretical width a0 as much as possible and the actual length b1 of the relatively flat region of the light-emitting structure is equal to the theoretical length b0 as much as possible, that is, it is desirable that the film thicknesses of the light-emitting structures in respective regions are equal. On the other hand, the light-emitting structure often has an appearance in the long-axis direction different from an appearance in the short-axis direction. For example, the surface of the light-emitting structure is convex (in the "W" shape), concave (in the "U" or "V" shape), in the "M" shape, or the like.

In the solution-applying process, the ratio of the flat portion in the long-axis direction of the light-emitting structure and the ratio of the flat portion in the short-axis direction are not the same. That is, under the same decompression drying condition, the value of a1/a0 differs greatly from the value of b1/b0. It is often possible to achieve a good flatness in the short-axis direction of the light-emitting structure under a certain decompression drying condition, but the flatness in the long-axis direction is often poor. The main reason of causing this problem is that: during the depressurization drying process, the micro-force suffered by the solvent and/or solute in the long-axis direction of the pixel region is different from the micro-force suffered by the solvent and/or solute in the short-axis direction of the pixel region, causing the solute distribution to be nonuniform.

In the method for manufacturing the light-emitting layer provided by embodiments of the present disclosure, a solution is formed on the barrier wall structures which are between the pixel regions; during a drying process of a solution in the pixel regions, the presence of the solution on the barrier wall structures makes a micro-force in the first direction and another micro-force in the second direction that the solution in the pixel regions is subjected to tend to be the same, so that the distribution of the solute in the first direction and the distribution of the solute in the second direction tend to be the same, thus eliminating the phenomenon of poor thickness uniformity of the light-emitting structure caused by the nonuniform distribution of the solute, and finally improving the uniformity of the light-emitting layer. For the method for manufacturing the light-emitting layer provided by the embodiments of the present disclosure, please refer to the following descriptions.

FIG. 2 is a flowchart showing the method for manufacturing the light-emitting layer according to the embodiments of the present disclosure. The method for manufacturing the light-emitting layer is used to manufacture the light-emitting layer in the electroluminescent device, for example. Referring to FIG. 2, the method includes the following steps.

Step 201: providing a base substrate formed with a pixel definition layer, so that the pixel definition layer includes a plurality of barrier wall structures, the plurality of barrier wall structures define a plurality of pixel regions arranged in an array on the base substrate, the plurality of pixel regions include a plurality of pixel regions arranged along a first direction and a plurality of pixel regions arranged along a second direction, and a distance between any adjacent two of the pixel regions arranged along the first direction is greater than a distance between any adjacent two of the pixel regions arranged along the second direction.

FIG. 3 is a schematic view of the base substrate provided with the pixel definition layer 011 according to the embodiments of the present disclosure. Referring to FIG. 3, the pixel definition layer 011 includes the plurality of barrier wall structures (three first barrier wall structures 0111 adjacent to each other and two second barrier wall structures 0112 adjacent to each other are shown in FIG. 3 as an example), the plurality of barrier wall structures define the plurality of pixel regions P arranged in the array on the base substrate, the plurality of pixel regions P include the plurality of pixel regions P arranged along the first direction x and the plurality of pixel regions P arranged along the second direction y, and the distance x1 between any adjacent two of the pixel regions P arranged along the first direction x is greater than the distance y1 between any adjacent two of the pixel regions arranged along the second direction y. As shown in FIG. 3, in the embodiments of the present disclosure, the plurality of barrier wall structures include a plurality of first barrier wall structures 0111 and a plurality of second barrier wall structures 0112, the first barrier wall structures 0111 are ones of the plurality of barrier wall structures between the pixel regions P arranged along the first direction x, and the second barrier wall structures 0112 are ones of the plurality of barrier wall structures between the pixel regions P arranged along the second direction y. Therefore, the distance x1 between any adjacent two of the pixel regions P arranged along the first direction x is a width of the first barrier wall structure 0111, the distance y1 between any adjacent two of the pixel regions P arranged along the second direction y is a width of the second barrier wall structure 0112.

For example, the base substrate is a transparent base substrate. For example, the base substrate is a base substrate formed of a light-transmitting and non-metallic material having a certain strength such as glass, quartz or a transparent resin. Alternatively, for example, the base substrate is a flexible base substrate formed of a material such as polyimide (abbreviation: PI). The pixel definition layer 011 is formed, for example, by a patterning process and using a hydrophobic transparent resin material. For example, a layer of hydrophobic transparent resin material is formed on the base substrate by coating, magnetron sputtering, thermal evaporation or plasma enhanced chemical vapor deposition (PECVD) or the like, to obtain a resin material layer; then the resin material layer is patterned by a patterning process to obtain the pixel definition layer 011. The patterning process for example includes photoresist coating, exposure, development, etching, and photoresist stripping. Performing the patterning process on the resin material layer to obtain the pixel definition layer 011, for example, includes: forming a photoresist layer by coating a layer of a photoresist with a certain thickness on the resin material layer; exposing the photoresist layer with a mask so that the photoresist layer forms a fully exposed region and a non-exposed region; then performing a developing process on the photoresist layer so that the photoresist in the fully exposed region is removed and the photoresist in the non-exposed region is retained; then etching a region of the resin material layer corresponding to the fully exposed region by using an etching process to form the pixel regions in the resin material layer; and finally stripping off the photoresist in the non-exposed region to obtain the pixel definition layer 011 as shown in FIG. 3.

Step 202: by a solution-applying process, forming a solution layer on the base substrate formed with the pixel definition layer, so that the solution layer includes a solution formed in the plurality of pixel regions and a solution formed on the first barrier wall structures, and the solution in any one of the plurality of pixel regions does not blend with the solution on the first barrier wall structures defining the any one of the plurality of pixel regions.

Figure 4:
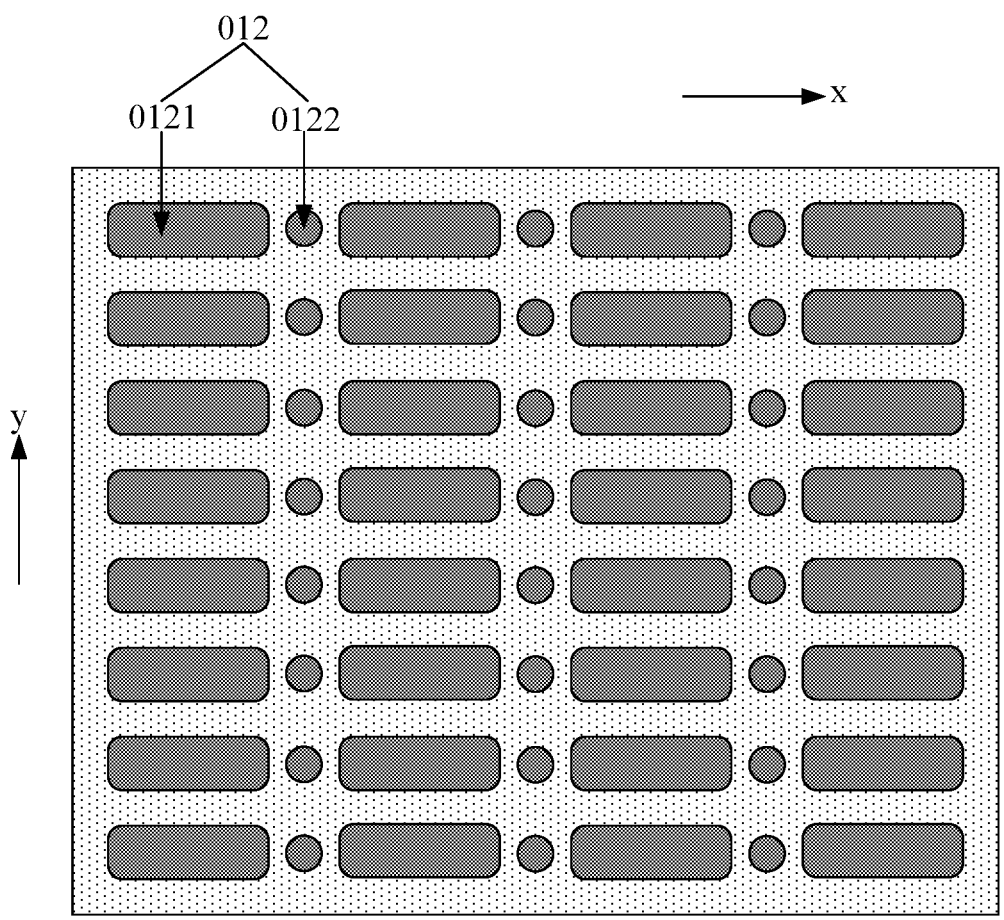
FIG. 4 is a schematic view illustrating that a solution layer is formed on the base substrate formed with the pixel definition layer according to the embodiments of the present disclosure.

For example, the solution-applying process includes, but is not limited to, an inkjet printing process, a spin coating process, a screen printing process, or a transfer process, or the like. FIG. 4 is a schematic view showing that the solution layer 012 is formed on the base substrate provided with the pixel definition layer 011 according to the embodiments of the present disclosure. Referring to FIG. 3 and FIG. 4, the solution layer 012 includes the solution 0021 formed in the plurality of pixel regions P and the solution 0122 formed on the first barrier wall structures 0111, and the solution 0121 in any one of the plurality of pixel regions P does not blend with the solution 0122 on the first barrier wall structures 0111 defining the any one of the plurality of pixel regions P. For example, a volume of the solution on any one of the first barrier wall structures 0111 of the pixel definition layer 011 ranges from 1 picoliter to 200 picoliters. For example, the volume of the solution on any one of the first barrier wall structures 0111 of the pixel definition layer 011 ranges from 10 picoliters to 100 picoliters. It should be noted that, in the embodiments of the present disclosure, for example, the material for forming the pixel definition layer 011 is the hydrophobic transparent resin material, which makes the solution have poor fluidity on the surface of the pixel definition layer 011. After the solution layer 012 is formed, as shown in FIG. 4, the solution 0121 in the pixel regions P is well defined in the pixel regions P, and the solution 0122 on the first barrier wall structures 0111 is well defined on the first barrier wall structures 0111, so that the solution 0121 in the pixel regions P is spaced from the solution 0122 on the first barrier wall structures 0111. Moreover, the solution 0122 on the first barrier wall structures 0111 is in a hemispherical shape on the first barrier wall structures 0111, for example.

In the embodiments of the present disclosure, the solution layer 012 is formed by one solution-applying process or is formed by two solution-applying processes. In a situation where the solution layer 012 is formed by the one solution-applying process, the solution in the pixel regions P and the solution on the first barrier wall structures 0111 are simultaneously formed by the one solution-applying process, for example; in a situation where the solution layer 012 is formed by the two solution-applying processes, first the solution 0121 in the plurality of pixel regions P is formed by a first solution-applying process, and then the solution 0122 on the first barrier wall structures 0111 is formed by a second solution-applying process, to obtain the solution layer 012. For example, firstly the solution 0122 on the first barrier wall structures 0111 is formed by the second solution-applying process, and then the solution 0121 in the plurality of pixel regions P is formed by the first solution-applying process, which is not limited in the embodiments of the present disclosure. In the embodiments of the present disclosure, the first solution-applying process and the second solution-applying process are the same or different. For example, the first solution-applying process includes the inkjet printing process, and the second solution-applying process includes any one of the inkjet printing process and a spray process. It should be noted that, whether the solution in the pixel regions P and the solution on the first barrier wall structures 0111 are formed by the one solution-applying process or by the two solution-applying processes, the solution in the pixel regions P and the solution on the first barrier wall structures 0111 are the same solution, for example.

Step 203: drying the solution layer so that the solution in each of the plurality of pixel regions forms a light-emitting structure to obtain the light-emitting layer.

For example, the solution layer is dried by using the depressurization drying process. In this process, the solvent in the pixel regions volatilizes, and the solute dries to form the light-emitting structure, thereby obtaining the light-emitting layer. The process of drying the solution layer by using the depressurization drying process, for example, includes: placing the base substrate formed with the solution layer in a closed cavity, and then drawing off gas in the closed cavity so that a gas pressure in the closed cavity is reduced to dry the solution layer. It should be noted that during drying the solution layer by the depressurization drying process, the solvent on the first barrier wall structures 0111 also volatilizes, and the solute on the first barrier wall structures 0111 dries and remains on the first barrier wall structures 0111. However, for the electroluminescent device, the presence of the barrier wall structures does not affect the display, so the solute remaining on the first barrier wall structures 0111 does not affect the display. It should be noted that the specific process of the depressurization drying process provided by the embodiments of the present disclosure is merely exemplary, the implementation process of the depressurization drying process may refer to related technologies, and repeated descriptions are omitted in the embodiments of the present disclosure.

It should be noted that, in practical applications, the amount of the solution on the first barrier wall structure 0111 is adjusted according to actual conditions, so that the solvent in the pixel region volatilizes relatively evenly in both the long-axis direction and the short-axis direction. The volatilization in the long-axis direction and the volatilization in the short-axis direction are relatively even, so that the solute is relatively uniformly distributed in the long-axis direction and the short-axis direction, and the thickness uniformity of the formed light-emitting structure is ensured. The method for manufacturing the light-emitting layer provided by the embodiments of the disclosure has a simple process and optimizes the performance of the light-emitting layer.

In summary, in the method for manufacturing the light-emitting layer provided by the embodiments of the present disclosure, because the solution is disposed on the first barrier wall structures, the solution on the first barrier wall structures ensures that the micro-force in the first direction and another micro-force in the second direction that the solution in the pixel regions is subjected to tend to be the same in the process of drying the solution layer, so that the distribution of the solute in the first direction and the distribution of the solute in the second direction tend to be the same, thus eliminating the phenomenon of poor thickness uniformity of the light-emitting structure caused by the nonuniform distribution of the solute, and finally improving the uniformity of the light-emitting layer.

Figure 5:
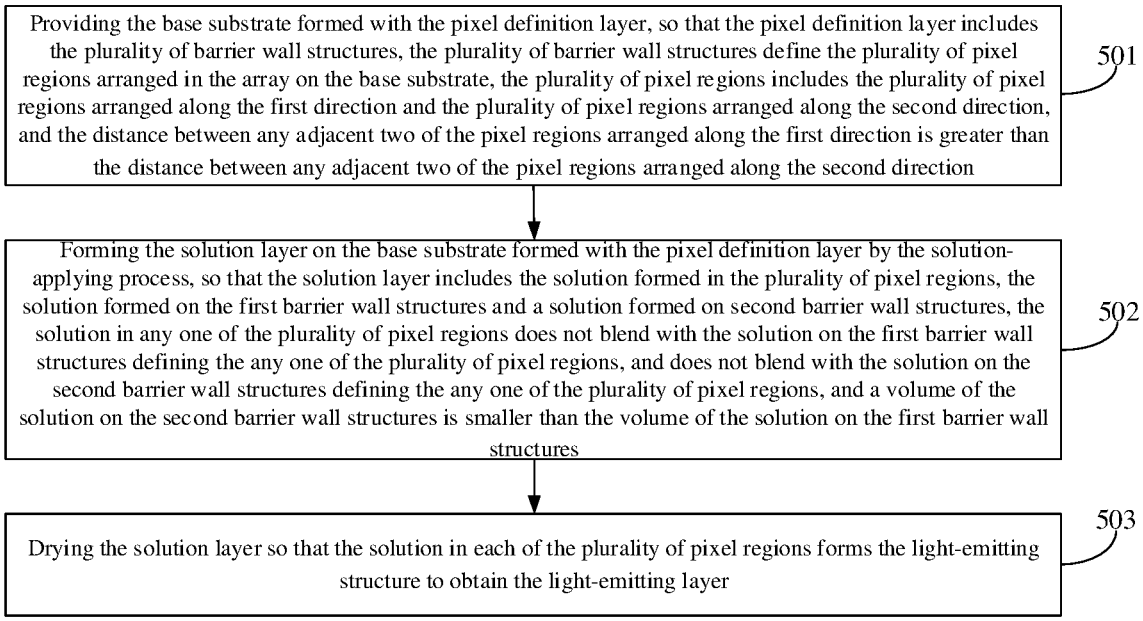
FIG. 5 is another flowchart of the method for manufacturing the light-emitting layer according to the embodiments of the present disclosure.

FIG. 5 is another flowchart of the method for manufacturing the light-emitting layer according to the embodiments of the present disclosure, and the method for manufacturing the light-emitting layer for example is used to manufacture the light-emitting layer in the electroluminescent device. Referring to FIG. 5, the method includes the following steps.

Step 501: providing the base substrate formed with the pixel definition layer, so that the pixel definition layer includes the plurality of barrier wall structures, the plurality of barrier wall structures define the plurality of pixel regions arranged in the array on the base substrate, the plurality of pixel regions includes the plurality of pixel regions arranged along the first direction and the plurality of pixel regions arranged along the second direction, and the distance between any adjacent two of the pixel regions arranged along the first direction is greater than the distance between any adjacent two of the pixel regions arranged along the second direction.

For the implementation of the step 501, for example, reference may be made to the step 201 in the embodiments shown in FIG. 2, which is not described herein again.

Step 502: forming the solution layer on the base substrate formed with the pixel definition layer by the solution-applying process, so that the solution layer includes the solution formed in the plurality of pixel regions, the solution formed on the first barrier wall structures and a solution formed on second barrier wall structures, the solution in any one of the plurality of pixel regions does not blend with the solution on the first barrier wall structures defining the any one of the plurality of pixel regions, and does not blend with the solution on the second barrier wall structures defining the any one of the plurality of pixel regions, and a volume of the solution on the second barrier wall structures is smaller than the volume of the solution on the first barrier wall structures.

Figure 6:
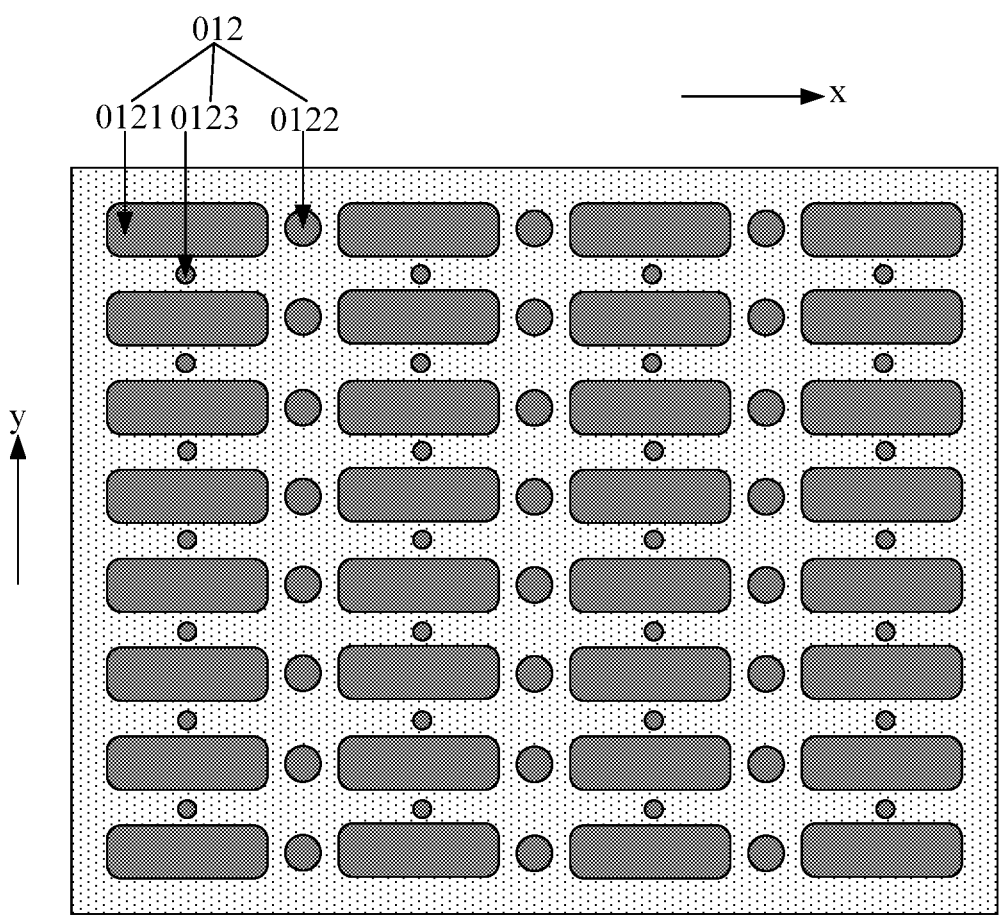
FIG. 6 is another schematic view illustrating that the solution layer is formed on the base substrate formed with the pixel definition layer according to the embodiments of the present disclosure.

For example, the solution-applying process includes, but is not limited to, the inkjet printing process, the spin coating process, the screen printing process, or the transfer process, or the like. FIG. 6 is another schematic view illustrating that the solution layer 012 is formed on the base substrate provided with the pixel definition layer 011 according to the embodiments of the present disclosure. Referring to FIG. 3 and FIG. 6, the solution layer 012 includes the solution 0121 formed in the plurality of pixel regions P1, the solution 0122 formed on the first barrier wall structures 0111 and the solution 0123 formed on the second barrier wall structures 0112. The solution 0121 in any one of the plurality of pixel regions P does not blend with the solution 0122 on the first barrier wall structures 0111 defining the any one of the plurality of pixel regions P; and the solution 0121 in any one of the plurality of pixel regions P does not blend with the solution 0123 on the second barrier wall structures 0112 defining the any one of the plurality of pixel regions P. It should be noted that, in the embodiments of the present disclosure, for example, the material for forming the pixel definition layer 011 is the hydrophobic transparent resin material, which makes the solution have the poor fluidity on the surface of the pixel definition layer 011. After the solution layer 012 is formed, as shown in FIG. 3 and FIG. 6, the solution 0121 in the pixel regions P is well defined in the pixel regions P, the solution 0122 on the first barrier wall structures 0111 is well defined on the first barrier wall structures 0111, and the solution 0123 on the second barrier wall structures 01121 is well defined on the second barrier wall structures 0112. Moreover, the solution 0122 on the first barrier wall structures 0111 is in the hemispherical shape on the first barrier wall structures 0111, for example; the solution 0123 on the second barrier wall structures 0112 is in the hemispherical shape on the second barrier wall structures 0112, for example.

In the embodiments of the present disclosure, the solution layer 012 is formed by the one solution-applying process, or is formed by the two solution-applying processes, or is formed by three solution-applying processes, for example. In the situation where the solution layer 012 is formed by the one solution-applying process, the solution in the pixel regions P, the solution on the first barrier wall structures 0111 and the solution on the second barrier wall structures 0112 are simultaneously formed by the one solution-applying process; in the situation where the solution layer 012 is formed by the two solution-applying processes, for example, firstly the solution 0121 is formed in the plurality of pixel regions P by the first solution-applying process, and then the solution 0122 on the first barrier wall structures 0111 and the solution 0123 on the second barrier wall structures 0112 are formed by the second solution-applying process, to obtain the solution layer 012; in a situation where the solution layer 012 is formed by the three solution-applying processes, for example, firstly the solution 0121 is formed in the plurality of pixel regions P by the first solution-applying process, then the solution 0122 is formed on the first barrier wall structures 0111 by the second solution-applying process, and finally the solution 0123 is formed on the second barrier wall structures 0112 by a third solution-applying process, to obtain the solution layer 012. Of course, in practical applications, the process of forming the solution 0121 in the pixel regions P, the process of forming the solution 0122 on the first barrier wall structures 0111 and the process of forming the solution 0123 on the second barrier wall structures 0112 are not limited, and the embodiments of the present disclosure do not limit the forming order of the solution 0121, the solution 0122 and the solution 0123. It should be noted that, whether the solution in the pixel regions P, the solution on the first barrier wall structures 0111 and the solution on the second barrier wall structures 0112 are formed by the one solution-applying process or by the two solution-applying processes or by the three solution-applying processes, the solution in the pixel regions P, the solution on the first barrier wall structures 0111 and the solution on the second barrier wall structures 0112 are the same solution, for example.

Step 503: drying the solution layer so that the solution in each of the plurality of pixel regions forms the light-emitting structure to obtain the light-emitting layer.

For the implementation of the step 503, for example, reference may be made to the step 203 in the embodiments shown in FIG. 2, which is not described herein again. However, it should be noted that during drying the solution layer 012 by the depressurization drying process, the solvent on the second barrier wall structures 0112 volatilizes, and the solute on the second barrier wall structures 0112 dries and remains on the second barrier wall structures 0112. For the electroluminescent device, the presence of the barrier wall structures does not affect the display, so the solute on the second barrier wall structures 0112 does not affect the display.

It should be noted that the amount of the solution on the first barrier wall structure 0111 and the amount of the solution on the second barrier wall structure 0112 are adjusted according to actual conditions, so that the solvent in the pixel region volatilizes relatively evenly in both the long-axis direction and the short-axis direction. The volatilization in the long-axis direction and the volatilization in the short-axis direction are relatively even, so that the solute is relatively uniformly distributed in the long-axis direction and the short-axis direction, and the thickness uniformity of the formed light-emitting structure is ensured. The method for manufacturing the light-emitting layer provided by the embodiments of the disclosure has the simple process and optimizes the performance of the light-emitting layer.

In summary, in the method for manufacturing the light-emitting layer provided by the embodiments of the present disclosure, because the solution is disposed on the first barrier wall structures, the solution on the first barrier wall structures ensures that the micro-force in the first direction and another micro-force in the second direction that the solution in the pixel regions is subjected to tend to be the same in the process of drying the solution layer, so that the distribution of the solute in the first direction and the distribution of the solute in the second direction tend to be the same, thus eliminating the phenomenon of poor thickness uniformity of the light-emitting structure caused by the nonuniform distribution of the solute, and finally facilitating the improvement of the uniformity of the light-emitting layer.

Figure 7:
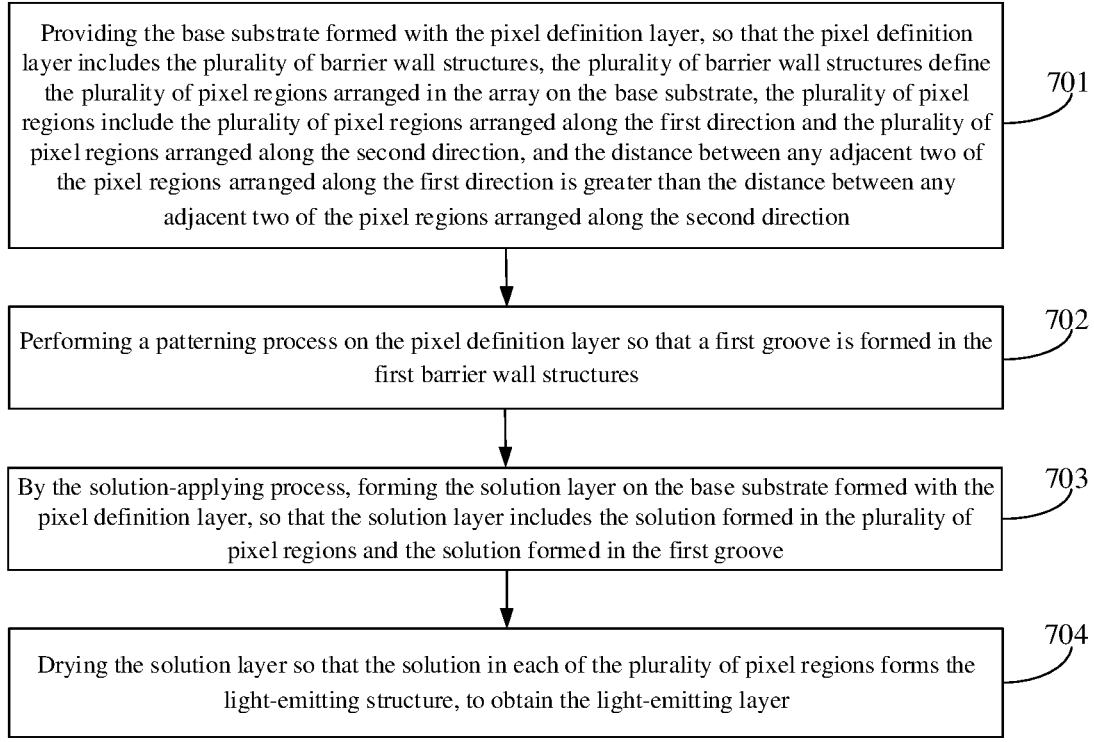
FIG. 7 is still another flowchart of the method for manufacturing the light-emitting layer according to the embodiments of the present disclosure.

FIG. 7 is another flowchart of the method for manufacturing the light-emitting layer according to the embodiments of the disclosure. The method for manufacturing the light-emitting layer is used to manufacture the light-emitting layer in the electroluminescent device, for example. Referring to FIG. 7, the method includes the following steps.

Step 701: providing the base substrate formed with the pixel definition layer, so that the pixel definition layer includes the plurality of barrier wall structures, the plurality of barrier wall structures define the plurality of pixel regions arranged in the array on the base substrate, the plurality of pixel regions include the plurality of pixel regions arranged along the first direction and the plurality of pixel regions arranged along the second direction, and the distance between any adjacent two of the pixel regions arranged along the first direction is greater than the distance between any adjacent two of the pixel regions arranged along the second direction.

For the implementation of the step 701, for example, reference may be made to the step 201 in the embodiments shown in FIG. 2, which is not described herein again.

Step 702: performing a patterning process on the pixel definition layer so that a first groove is formed in the first barrier wall structures.

Figure 8:
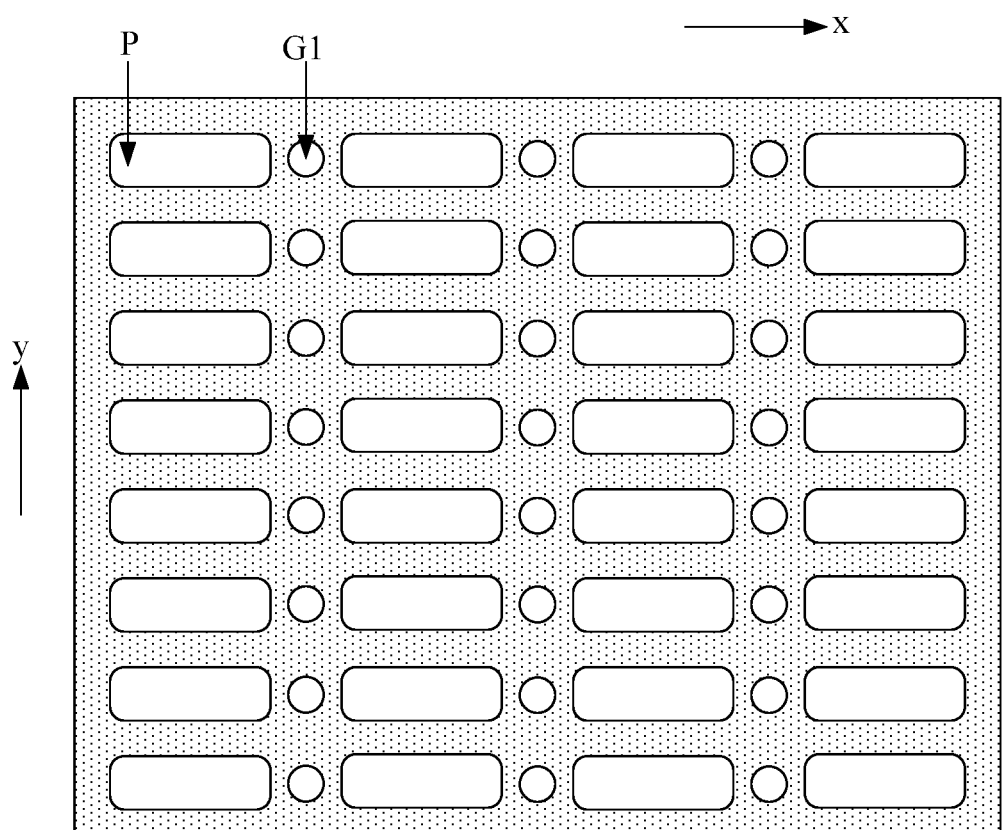
FIG. 8 is a schematic view illustrating that a first groove is formed on a first barrier wall structure according to the embodiments of the present disclosure.
Figure 9:
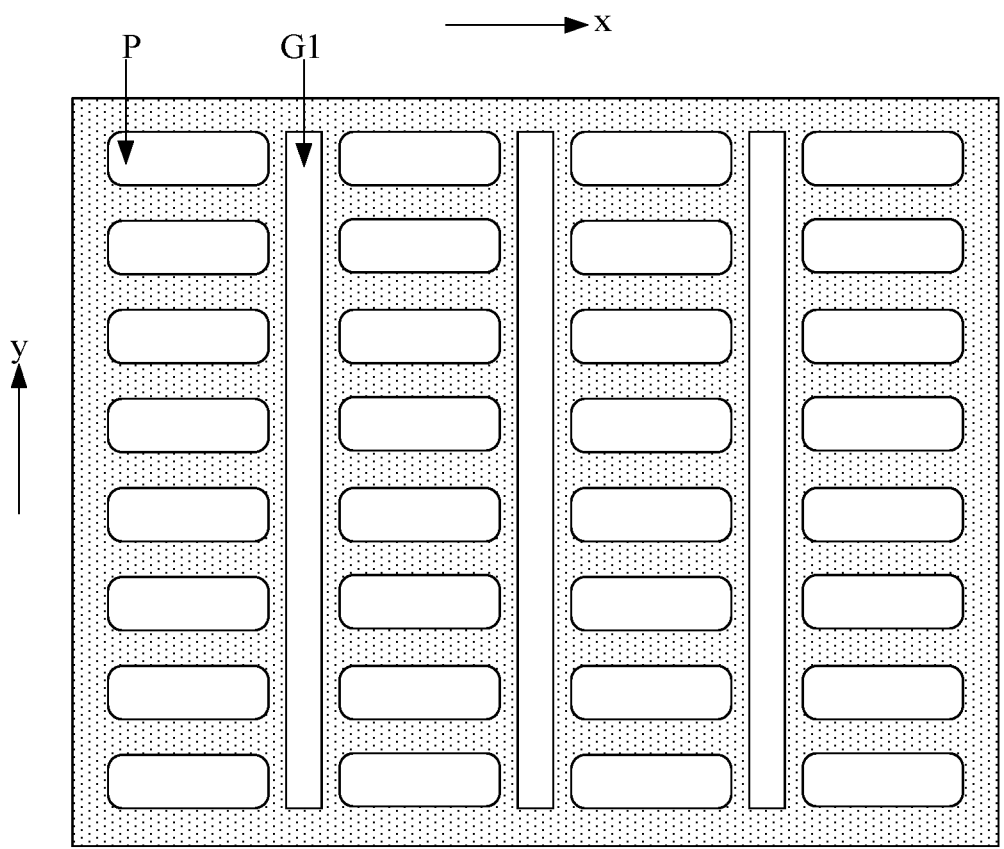
FIG. 9 is another schematic view illustrating that the first groove is formed on the first barrier wall structure according to the embodiments of the present disclosure.

FIG. 8 and FIG. 9 are schematic views showing two forms of the first groove G1 formed in the first barrier wall structures (not labelled in FIG. 8 and FIG. 9) according to the embodiments of the present disclosure. Referring to FIG. 8, a shape of the first groove G1 on an opening side of the first groove G1 is circular; or, referring to FIG. 9, the shape of the first groove G1 on the opening side of the first groove G1 is tetragonal. As shown in FIG. 9, in a situation where the shape of the first groove G1 on the opening side of the first groove G1 is tetragonal, a plurality of the first grooves G1 in the first barrier wall structures 011 which are on a same side of the pixel regions P arranged along the second direction y communicate with each other.

In the embodiments of the present disclosure, in conjunction with FIG. 3, FIG. 8, and FIG. 9, for example, the patterning process is performed on the pixel definition layer 011 so that the first groove G1 is formed in the first barrier wall structures 0111. There is a certain distance between the first groove G1 and the pixel regions P, to avoid that the solution in the first groove G1 blends with the solution in the pixel regions P after forming the solution layer in subsequent steps. The patterning process includes photoresist coating, exposure, development, etching and photoresist stripping. Therefore, for example, performing the patterning process on the pixel definition layer 011 so that the first groove G1 is formed in the first barrier wall structures 0111 includes: coating a layer of photoresist having a certain thickness on the barrier wall structures of the pixel definition layer 011; exposing the photoresist layer by using a mask so that the photoresist layer forms a fully exposed region and a non-exposed region; then performing a developing process on the photoresist layer so that the photoresist in the fully exposed region is removed and the photoresist in the non-exposed region is retained; then etching a region of the pixel definition layer 011 (that is, a region of the first barrier wall structures 0111) corresponding to the fully exposed region by using an etching process, so that the first groove G1 is formed in the pixel definition layer 011; and finally the photoresist in the non-exposed region is stripped off to obtain a structure as shown in FIG. 8 or FIG. 9. For example, the region in which the first groove G1 is formed is etched by a half etching process to avoid that the pixel definition layer 011 is etched through, thereby preventing the transistor circuit under the pixel definition layer 011 from being exposed.

It should be noted that, in the embodiments of the present disclosure, for example, the first groove G1 and the pixel regions P are formed by the same patterning process. In this case, for example, the layer of hydrophobic transparent resin material is deposited on the base substrate by coating, magnetron sputtering, thermal evaporation or PECVD or the like to obtain the resin material layer; then the resin material layer is patterned by the patterning process to obtain the pixel definition layer 011, so that the pixel definition layer 011 includes the plurality of pixel regions P arranged in the array and the first groove G1 formed in the first barrier wall structures 0111.

Step 703: by the solution-applying process, forming the solution layer on the base substrate formed with the pixel definition layer, so that the solution layer includes the solution formed in the plurality of pixel regions and the solution formed in the first groove.

Figure 10:
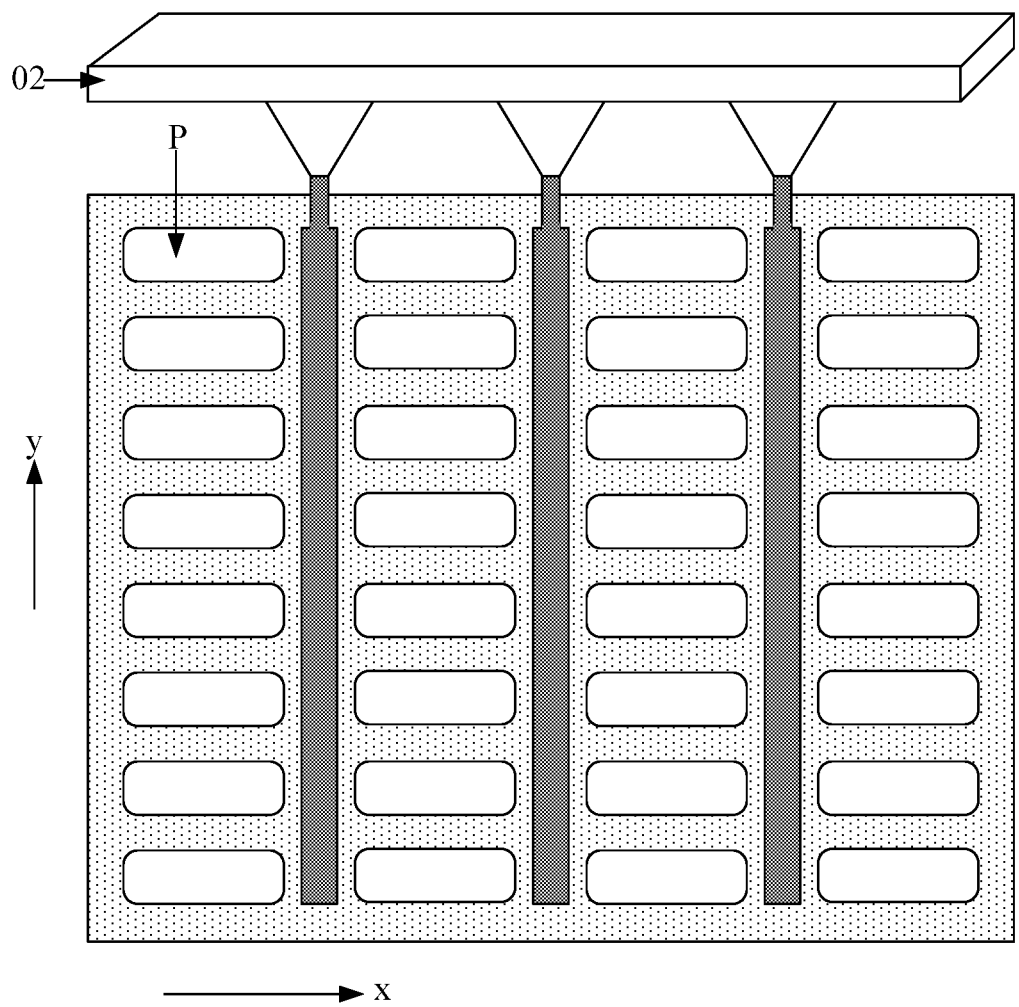
FIG. 10 is a schematic view illustrating that a solution is formed on the first barrier wall structure according to the embodiments of the present disclosure.

For the implementation of the step 703, for example, reference may be made to the step 202 in the embodiments shown in FIG. 2, which is not described herein again. However, it should be noted that, for the pixel definition layer shown in FIG. 9, as shown in FIG. 10, for example, a nozzle coating device 02 is used to coat the solution in the first groove G1 along a length direction of the first groove G1, so that the solution in the first groove G1 is formed; and then the solution in the pixel regions P is filled by the solution-applying process (for example, the inkjet printing process), to form the solution layer on the base substrate formed with the pixel definition layer. It should be noted that, in the embodiments of the present disclosure, the first groove G1 is formed in the first barrier wall structures, and the first groove G1 defines the solution at a fixed position of the first barrier wall structures, so as to prevent the solution from flowing on the first barrier wall structures.

Step 704: drying the solution layer so that the solution in each of the plurality of pixel regions forms the light-emitting structure, to obtain the light-emitting layer.

For the implementation of the step 704, for example, reference may be made to the step 503 in the embodiments shown in FIG. 5, which is not described herein again. However, it should be noted that during drying the solution layer by the depressurization drying process, the solvent in the first groove G1 also volatilizes, and the solute in the first groove G1 also dries and remains in the first groove G1; because the first groove G1 is in the first barrier wall structures 0111, and for the electroluminescent device, the presence of the barrier wall structures does not affect the display, so the solute in the first groove G1 does not affect the display.

It should be noted that the embodiments of the present disclosure are described by taking the groove being formed in the first barrier wall structures as an example. In a practical application, according to the solution shown in FIG. 5, for example, the groove is further formed in the second barrier wall structures to facilitate forming the solution on the second barrier wall structures, which is not described herein again.

In summary, in the method for manufacturing the light-emitting layer provided by the embodiments of the present disclosure, because the solution is disposed on the first barrier wall structures, the solution on the first barrier wall structures ensures that the micro-force in the first direction and another micro-force in the second direction that the solution in the pixel regions is subjected to tend to be the same in the process of drying the solution layer, so that the distribution of the solute in the first direction and the distribution of the solute in the second direction tend to be the same, thus eliminating the phenomenon of poor thickness uniformity of the light-emitting structure caused by the nonuniform distribution of the solute, and facilitating the improvement of the uniformity of the light-emitting layer.

Figure 11:
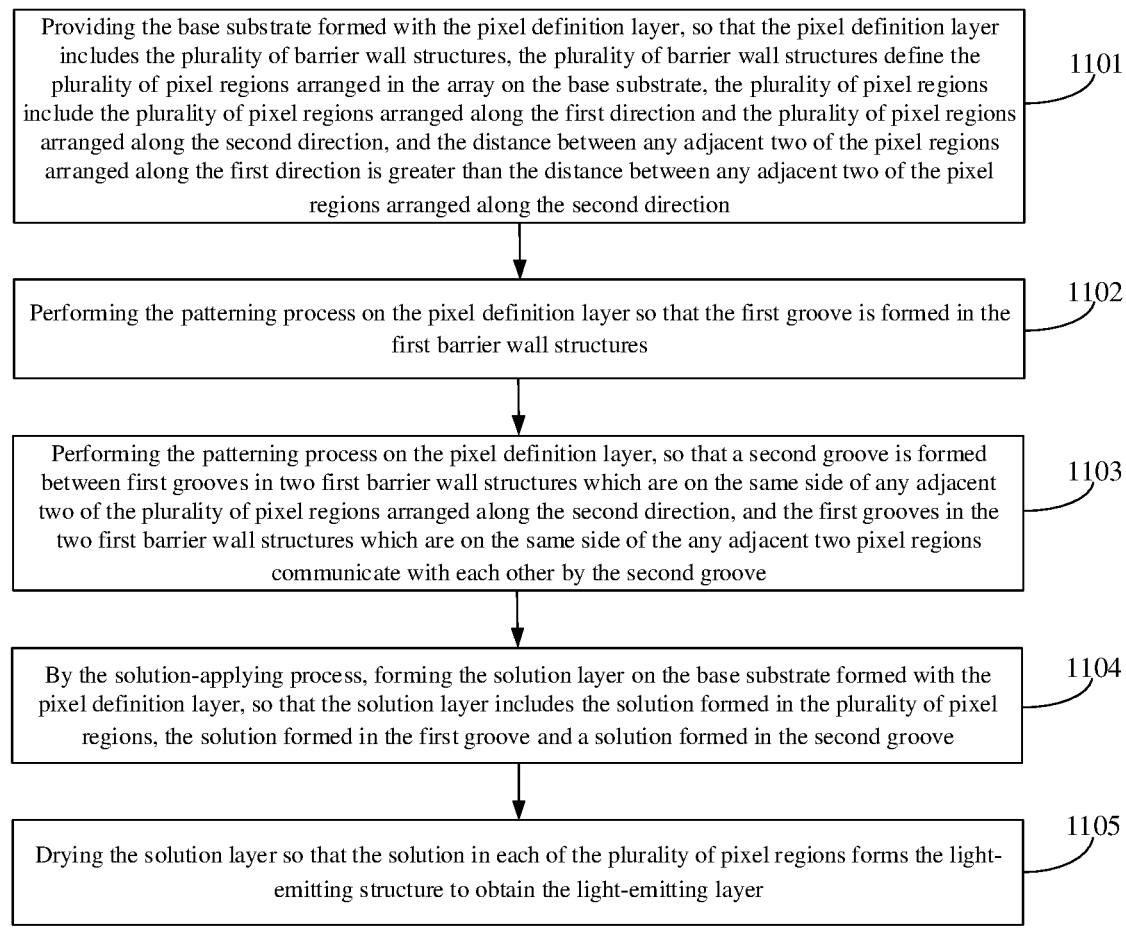
FIG. 11 is still another flowchart of the method for manufacturing the light-emitting layer according to the embodiments of the present disclosure.

FIG. 11 is still another flowchart of the method for manufacturing the light-emitting layer according to the embodiments of the present disclosure. The method for manufacturing the light-emitting layer is used to manufacture the light-emitting layer in the electroluminescent device, for example. Referring to FIG. 11, the method includes the following steps.

Step 1101: providing the base substrate formed with the pixel definition layer, so that the pixel definition layer includes the plurality of barrier wall structures, the plurality of barrier wall structures define the plurality of pixel regions arranged in the array on the base substrate, the plurality of pixel regions include the plurality of pixel regions arranged along the first direction and the plurality of pixel regions arranged along the second direction, and the distance between any adjacent two of the pixel regions arranged along the first direction is greater than the distance between any adjacent two of the pixel regions arranged along the second direction.

Step 1102: performing the patterning process on the pixel definition layer so that the first groove is formed in the first barrier wall structures.

For the implementation of the step 1101 and the step 1102, for example, reference may be made to the step 701 and the step 702 in the embodiments shown in FIG. 7, which is not described herein again.

Step 1103, performing the patterning process on the pixel definition layer, so that a second groove is formed between first grooves being in two first barrier wall structures which are on the same side of any adjacent two of the plurality of pixel regions arranged along the second direction, and the first grooves being in the two first barrier wall structures which are on the same side of the any adjacent two of the plurality of pixel regions arranged along the second direction communicate with each other by the second groove.

Figure 12:
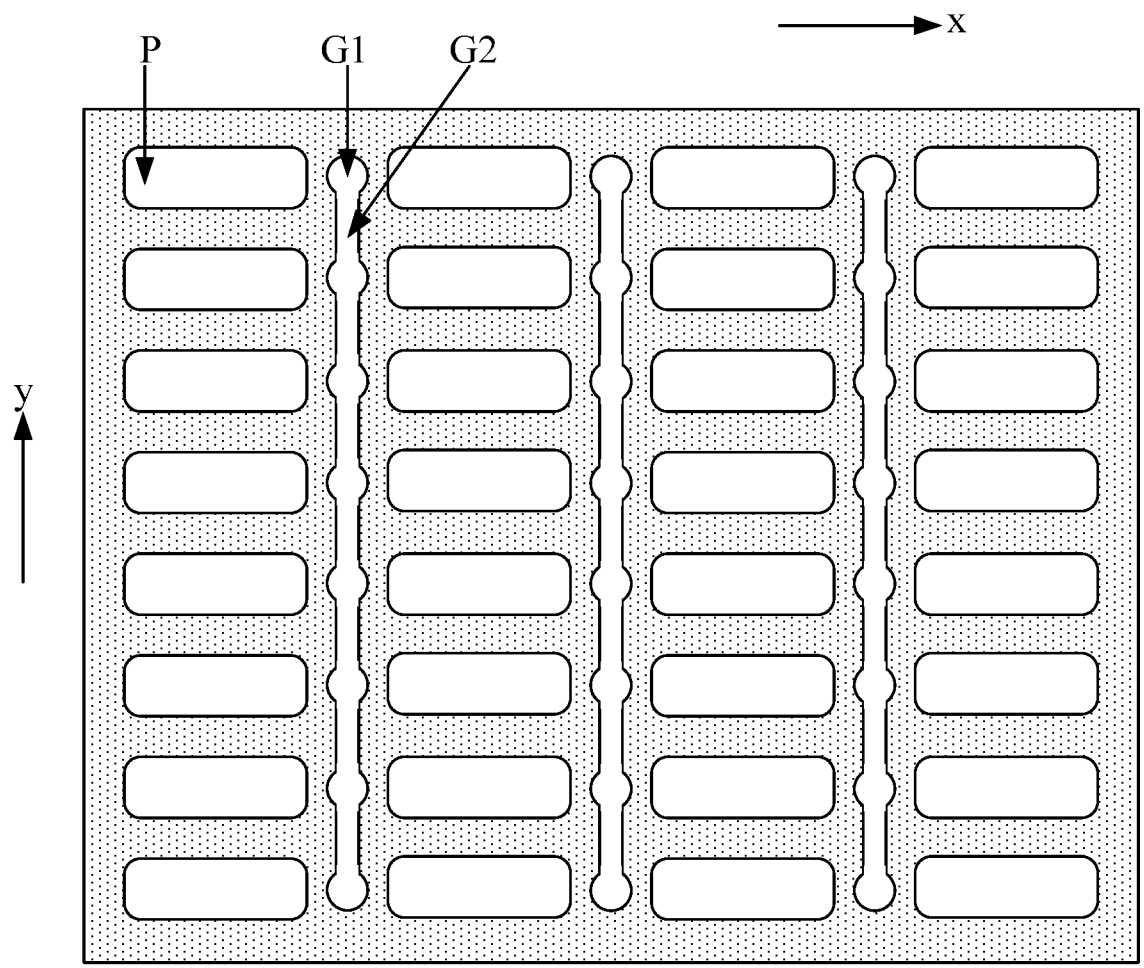
FIG. 12 is a schematic view illustrating that the first grooves communicates with each other through a second groove according to the embodiments of the disclosure.

FIG. 12 is a schematic view illustrating that the first grooves communicate with each other through the second groove according to the embodiments of the disclosure. Referring to FIG. 12, the shape of the first groove G1 on the opening side of the first groove G1 is circular, and the second groove G2 is formed between the first grooves G1 being in the two first barrier wall structures (not labelled in FIG. 12) which are on the same side of any adjacent two of the plurality of pixel regions P arranged along the second direction y, and the first grooves G1 being in the two first barrier wall structures which are on the same side of any adjacent two of the plurality of pixel regions arranged along the second direction communicate with each other by the second groove G2. In the embodiments of the present disclosure, for example, a depth of the first groove G1 is greater than or equal to a depth of the second groove G2, and an area of the first groove G1 on the opening side of the first groove G1 is greater than an area of the second groove G2 on the opening side of the second groove G2, in this way, it is ensured that after the solution layer is formed, the amount of the solution in the first groove G1 is greater than the amount of the solution in the second groove G2, and thus the solution in the grooves remains more in the first groove that just faces the pixel regions, so as to adjust the uniformity of the finally-formed light-emitting structure better.

In the embodiments of the present disclosure, in conjunction with FIG. 3, FIG. 8 and FIG. 12, for example, the pixel definition layer 011 is patterned by the patterning process, so that the second groove G2 is formed between the first grooves G1 being in the two first barrier wall structures which are on the same side of any adjacent two of the plurality of pixel regions P arranged along the second direction y. For the process of performing the patterning process on the pixel definition layer 011, for example, reference is made to step 702 in the embodiments shown in FIG. 7, which is not described herein again.

It should be noted that, in the embodiments of the present disclosure, for example, the first groove G1, the second groove G2 and the pixel regions P are formed by the same patterning process. In this case, for example, the layer of hydrophobic transparent resin material is formed on the base substrate by coating, magnetron sputtering, thermal evaporation or PECVD or the like to obtain the resin material layer, and then the patterning process is performed on the resin material layer to obtain the pixel definition layer 011, so that the pixel definition layer 011 includes the plurality of pixel regions P arranged in the array, the first groove G1 is formed in the first barrier wall structures 0111, and the second groove G2 is formed between the first grooves G1 being in the two first barrier wall structures which are on the same side of any adjacent two of the plurality of pixel regions P arranged along the second direction y.

Step 1104: by the solution-applying process, forming the solution layer on the base substrate formed with the pixel definition layer, so that the solution layer includes the solution formed in the plurality of pixel regions, the solution formed in the first groove and a solution formed in the second groove.

For the implementation of the step 1104, for example, reference may be made to the step 202 in the embodiments shown in FIG. 2, which is not described herein again. However, it should be noted that, for the pixel definition layer shown in FIG. 12, for example, a solution is coated in the first groove G1 and the second groove G2 by using the nozzle coating device, so that the solution in the first groove G1 and the solution in the second groove G2 are formed; and then the solution in the pixel regions P is filled by the solution-applying process (for example, the inkjet printing process) to form the solution layer on the base substrate formed with the pixel definition layer.

Step 1105: drying the solution layer so that the solution in each of the plurality of pixel regions forms the light-emitting structure to obtain the light-emitting layer.

For the implementation of the step 704, for example, reference may be made to the step 503 in the embodiments shown in FIG. 5, which is not described herein again. However, it should be noted that during drying the solution layer by the depressurization drying process, the solvent in the first groove G1 and the second groove G2 also volatilizes, and the solute in the first groove G1 and the second groove G2 also dries and remains in the first groove G1 and the second groove G2. The first groove G1 and the second groove G2 are both in the barrier wall structures, the presence of the barrier wall structures does not affect the display, and thus the solute in the first groove G1 and the solute in the second groove G2 do not affect the display.

It should be noted that the embodiments of the present disclosure are described by taking the grooves being in the first barrier wall structures as an example. In practical applications, as shown in FIG. 6, for example, the grooves are formed in the second barrier wall structures; and for example, the grooves formed in the second barrier wall structures communicate with each other to facilitate forming of the solution on the second barrier wall structures. Repeated descriptions are omitted in the embodiments of the present application.

In summary, in the method for manufacturing the light-emitting layer provided by the embodiments of the present disclosure, because the solution is disposed on the first barrier wall structures, the solution on the first barrier wall structures ensures that the micro-force in the first direction and another micro-force in the second direction that the solution in the pixel regions is subjected to tend to be the same in the process of drying the solution layer, so that the distribution of the solute in the first direction and the distribution of the solute in the second direction tend to be the same, thus eliminating the phenomenon of poor thickness uniformity of the light-emitting structure caused by the nonuniform distribution of the solute, and facilitating the improvement of the uniformity of the light-emitting layer.

The embodiments of the present disclosure also provide the electroluminescent device which includes the light-emitting layer manufactured by the method shown in any one of FIGS. 2, 5, 7 and 11.

For example, in practical applications, the electroluminescent device further includes the TFT layer, the anode layer, the PDL and the cathode layer, and the TFT layer, the anode layer and the PDL are sequentially stacked; the TFT layer, the anode layer and the PDL are between the light-emitting layer and the base substrates, and the cathode layer is on the light-emitting layer; the TFT layer includes the plurality of TFTs, the anode layer includes the plurality of anode structures; and the TFTs, the anode structures and the light-emitting structures of the light-emitting layer correspond to each other in the one-to-one manner. For the structure of the electroluminescent device, for example, refer to the related art. The light-emitting layer of the electroluminescent device provided by the embodiments of the disclosure has good uniformity, and thus the electroluminescent device has better display effect and long service life.

The embodiments of the present disclosure further provide a display device including the above electroluminescent device. The display device for example is any product or component having a display function such as an OLED display panel, a mobile phone, a tablet computer, a television, a display, a notebook computer, a digital photo frame, or a navigator.

The term "and/or" in the present disclosure is merely used for describing a relationship between associated objects, indicating that there may be three relationships. For example, A and/or B may indicate three cases that A exists independently, A and B exist simultaneously, and B exists independently. In addition, the character "I" in the present disclosure generally indicates that the fore-and-aft associated objects have an "or" relationship.

Those skilled in the art can understand that all or part of the steps of implementing the above embodiments may be completed by hardware or may be completed by using a program to execute related hardware, and the program may be stored in a computer readable storage medium. The storage medium mentioned above may be a read only memory, a magnetic disk or an optical disk or the like.

What are described above is related to the illustrative embodiments of the disclosure only and not limitative to the scope of the disclosure; the scopes of the disclosure are defined by the accompanying claims.

This application claims the benefit of Chinese patent application No. 201710758714.2 filed on Aug. 29, 2017, which is hereby entirely incorporated by reference as a part of the present application.

What is claimed is:

1. A method for manufacturing a display substrate, comprising:
providing a base substrate formed with a pixel definition layer, wherein the pixel definition layer comprises a plurality of barrier wall structures, the plurality of barrier wall structures comprise a plurality of first barrier wall structures and a plurality of second barrier wall structures, the plurality of barrier wall structures define a plurality of pixel regions arranged in an array on the base substrate, the plurality of pixel regions comprise a plurality of pixel regions arranged along a first direction and a plurality of pixel regions arranged along a second direction;

by a solution-applying process, forming a solution layer on the base substrate formed with the pixel definition layer, so that the solution layer comprises a solution formed in the plurality of pixel regions, a solution formed on the plurality of first barrier wall structures, and a solution formed on the plurality of second barrier wall structures, wherein the solution formed in the plurality of pixel regions, the solution formed on the plurality of first barrier wall structures, and the solution formed on the plurality of second barrier wall structures are formed of a same material, and wherein a distance between any adjacent two of the pixel regions arranged along the first direction is greater than a distance between any adjacent two of the pixel regions arranged along the second direction, the plurality of first barrier wall structures are between the pixel regions arranged along the first direction, the plurality of second barrier wall structures are between the pixel regions arranged along the second direction, and a volume of the solution on a single one of the plurality of second barrier wall structures is smaller than a volume of the solution on a single one of the plurality of first barrier wall structures; and performing a drying process simultaneously on the solution formed in the plurality of pixel regions, the solution formed on the plurality of first barrier wall structures and the solution formed on the plurality of second barrier wall structures, so that the solution in each of the plurality of pixel regions forms a light-emitting layer.

2. The method according to claim 1, wherein the plurality of first barrier wall structures are formed with at least one first groove, and the solution on the plurality of first barrier wall structures is in the at least one first groove, before forming the solution layer on the base substrate formed with the pixel definition layer by the solution-applying process, the method further comprises: forming the at least one first groove in the plurality of first barrier wall structures by performing a patterning process on the pixel definition layer.

3. The method according to claim 2, wherein a shape of the first groove on an opening side of the first groove is circular or rectangular.

4. The method according to claim 2, wherein the plurality of first barrier wall structures are formed with a plurality of the first grooves, the first grooves in the plurality of first barrier wall structures which are on a same side of any adjacent two of the plurality of pixel regions arranged along the second direction communicate with each other.

5. The method according to claim 4, wherein the forming the at least one first groove in the plurality of first barrier wall structures by performing the patterning process on the pixel definition layer comprises:

forming the first grooves in the plurality of first barrier wall structures by performing the patterning process on the pixel definition layer; and forming a second groove between the first grooves being in the two first barrier wall structures which are on the same side of any adjacent two of the plurality of pixel regions arranged along the second direction, so that any adjacent two of the first grooves communicate with each other through the second groove that is between the any adjacent two of the first grooves.

6. The method according to claim 5, wherein a depth of the first groove is greater than or equal to a depth of the second groove, and an area of the first groove on an opening side of the first groove is greater than an area of the second groove on an opening side of the second groove.

7. The method according to claim 5, wherein the pixel regions, the first groove and the second groove are formed by a same patterning process.

8. The method according to claim 1, wherein the forming the solution layer on the base substrate formed with the pixel definition layer by the solution-applying process so that the solution layer comprises the solution formed in the plurality of pixel regions and the solution formed on the plurality of first barrier wall structures, comprises:

forming the solution in the plurality of pixel regions by a first solution-applying process; and forming the solution on the plurality of first barrier wall structures by a second solution-applying process to obtain the solution layer.

9. The method according to claim 8, wherein the first solution-applying process comprises an inkjet printing process, and the second solution-applying process comprises any one of the inkjet printing process and a spray process.

10. The method according to claim 1, wherein a volume of the solution on any one of the first barrier wall structures ranges from 1 picoliter to 200 picoliters.

11. The method according to claim 10, wherein the volume of the solution on any one of the first barrier wall structures ranges from 10 picoliters to 100 picoliters.

12. A method for manufacturing a display substrate, comprising:

providing a base substrate formed with a pixel definition layer, wherein the pixel definition layer defines a plurality of pixel regions on the base substrate;

forming a solution on the plurality of pixel regions and a solution on the pixel definition layer, wherein the solution formed in the plurality of pixel regions and the solution formed on the pixel definition layer are formed of a same material; and simultaneously evaporating a solvent in the solution in the plurality of pixel regions and a solvent in the solution on the pixel definition layer;

wherein the forming the solution on the pixel definition layer comprises: forming the solution on the pixel definition layer between any adjacent two of the pixel regions, so that a volume of the solution on the pixel definition layer between the any adjacent two of the plurality of pixel regions is directly proportional to a distance between the any adjacent two of the plurality of pixel regions.

13. The method according to claim 12, wherein forming the solution on the pixel definition layer comprises: forming a groove in the pixel definition layer so that the solution is formed in the groove.

14. The method according to claim 13, wherein forming the groove in the pixel definition layer comprises: forming at least one groove in the pixel definition layer between the any adjacent two of the plurality of pixel regions.

15. The method according to claim 13, wherein forming the groove in the pixel definition layer comprises: forming at least one groove in the pixel definition layer, so that the groove extends along a direction to separate all the pixel regions into two parts.

16. The method according to claim 12, wherein the volume of the solution on the pixel definition layer between the any adjacent two of the plurality of pixel regions ranges from 1 picoliter to 200 picoliters.

17. The method according to claim 16, wherein the volume of the solution on the pixel definition layer between the any adjacent two of the plurality of pixel regions ranges from 10 picoliters to 100 picoliters.

18. The method according to claim 1, wherein
the solution formed in the plurality of pixel regions, the solution formed on the plurality of first barrier wall structures, and the solution formed on the plurality of second barrier wall structures are spaced from one another;
the plurality of first barrier wall structures are between shorter sides of the pixel regions arranged along the first direction, so that the solution formed on the plurality of first barrier wall structures is between the shorter sides of the pixel regions arranged along the first direction; and
the plurality of second barrier wall structures are between longer sides of the pixel regions arranged along the second direction, so that the solution formed on the plurality of second barrier wall structures is between the longer sides of the pixel regions arranged along the second direction.

19. The method according to claim 12, wherein the solution formed in the plurality of pixel regions is spaced apart from the solution formed on the pixel definition layer.

\* \* \* \* \*